United States Patent
Barak et al.

(10) Patent No.: US 10,318,395 B2
(45) Date of Patent: *Jun. 11, 2019

(54) CHECKING A COMPUTER PROCESSOR DESIGN FOR SOFT ERROR HANDLING

(71) Applicant: INTERNATIONAL BUSINESS MACHINES CORPORATION, Armonk, NY (US)

(72) Inventors: Erez Barak, Kfar Saba (IL); Nicol Hofmann, Stuttgart (DE); Cédric Lichtenau, Stuttgart (DE); Osher Yifrach, Modiin (IL)

(73) Assignee: INTERNATION BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/810,548

(22) Filed: Nov. 13, 2017

(65) Prior Publication Data
US 2018/0260311 A1   Sep. 13, 2018

Related U.S. Application Data

(63) Continuation of application No. 15/453,311, filed on Mar. 8, 2017.

(51) Int. Cl.
G06F 11/26 (2006.01)
G06F 17/50 (2006.01)
G06F 11/36 (2006.01)

(52) U.S. Cl.
CPC ........ *G06F 11/261* (2013.01); *G06F 11/3672* (2013.01); *G06F 17/5009* (2013.01)

(58) Field of Classification Search
CPC .... G06F 11/26–11/263; G06F 17/5009; G06F 17/5022

(Continued)

(56) References Cited

U.S. PATENT DOCUMENTS 6,539,503 B1 * 3/2003 Walker ............... G01R 31/3183
714/32
6,684,169 B2 * 1/2004 Masella, Jr. ... G01R 31/318342
702/66

(Continued)

OTHER PUBLICATIONS

Bustamante, Luis, "A Fault Injection Environment for the Evaluation of a Soft Error Detection Technique Based on Time Redundancy," Department of Electrical and Computer Engineering University of California, Davis, CA, USA, 2003 (no further date information available), pp. 1-6.

(Continued)

*Primary Examiner* — Joseph R Kudirka
(74) *Attorney, Agent, or Firm* — William Kinnaman, Esq.; Kevin P. Radigan, Esq.; Heslin, Rothenberg, Farley & Mesiti P.C.

(57) ABSTRACT

Checking a computer processor design for soft error handling. A baseline simulation of a computer processor design is monitored to identify a target processing cycle of the baseline simulation during which a predefined event occurs during the baseline simulation. The baseline simulation is performed in accordance with a software model of the computer processor design, and the event is associated with processing an instruction that directly involves a predefined error injection target. A test simulation of the computer processor design is performed in accordance with the software model of the computer processor design. An error is injected into the predefined error injection target during a target processing cycle of the test simulation. A determination is made as to whether the error is detected by error-checking logic of the computer processor design.

8 Claims, 3 Drawing Sheets

(58) Field of Classification Search
USPC ........................ 714/38.1, 41; 716/106, 136
See application file for complete search history.

(56) References Cited

U.S. PATENT DOCUMENTS

| | | | |
|---|---|---|---|
| 6,728,668 B1 * | 4/2004 | Kitamorn | G06F 11/261 |
| | | | 703/22 |
| 8,073,668 B2 | 12/2011 | Kellington et al. | |
| 8,453,082 B2 * | 5/2013 | Keidar-Barner | G06F 17/504 |
| | | | 716/106 |
| 8,572,729 B1 | 10/2013 | Zawalski et al. | |
| 8,595,680 B1 | 11/2013 | Steinberg | |
| 8,683,400 B1 * | 3/2014 | O'Riordan | G06F 17/5022 |
| | | | 703/13 |
| 8,949,101 B2 * | 2/2015 | Bose | G01R 31/318357 |
| | | | 703/14 |
| 9,208,043 B1 | 12/2015 | Tseng et al. | |
| 2015/0234962 A1 * | 8/2015 | Mazzawi | G06F 17/5045 |
| | | | 703/14 |

OTHER PUBLICATIONS

Barak, et al., "Checking a Computer Processor Design for Soft Error Handling," U.S. Appl. No. 15/453,311, filed Mar. 8, 2017, pp. 1-22.
List of IBM Patents and/or Patent Applications Treated as Related, dated Jan. 24, 2018, pp. 1-2.

* cited by examiner

US 10,318,395 B2

CHECKING A COMPUTER PROCESSOR DESIGN FOR SOFT ERROR HANDLING

CROSS-REFERENCE TO RELATED APPLICATIONS

This application is a continuation of co-pending U.S. patent application Ser. No. 15/453,311, filed Mar. 8, 2017, entitled "CHECKING A COMPUTER PROCESSOR DESIGN FOR SOFT ERROR HANDLING," which is hereby incorporated herein by reference in its entirety.

BACKGROUND

One challenge of designing computer processors is protecting against soft errors, where a bit-flip occurs spontaneously, such as due to radiation events. Since a soft error can change a data value stored in computer memory or affect the outcome of processing an instruction, soft error detection and handling logic is often incorporated into computer processor designs.

Computer processor designs are often tested by creating a model of a design using a hardware description language, such as VHSIC (Very High Speed Integrated Circuit) Hardware Description Language (VHDL), and performing a software simulation of the operation of the design based on the model. While such simulations may be employed to test the effects that soft errors have on a design, this can be particularly challenging where a design has a large logic state-space, and where logic for detecting and handling a specific error may behave differently for different instructions or data.

SUMMARY

Shortcomings of the prior art are overcome and additional advantages are provided through the provision of a method of checking a computer processor design for soft error handling. The method includes, for instance, monitoring a baseline simulation of a computer processor design to identify a target processing cycle of the baseline simulation during which a predefined event occurs during the baseline simulation. The baseline simulation is performed in accordance with a software model of the computer processor design. The predefined event is associated with processing an instruction that directly involves a predefined error injection target. A test simulation of the computer processor design is performed in accordance with the software model of the computer processor design. An error is injected into the predefined error injection target during a target processing cycle of the test simulation. A determination is made whether the error is detected by error-checking logic of the computer processor design.

Computer program products and systems relating to one or more aspects are also described and claimed herein.

Additional features and advantages are realized through the techniques described herein. Other embodiments and aspects are described in detail herein and are considered a part of the claimed aspects.

BRIEF DESCRIPTION OF THE DRAWINGS

Aspects of the invention will be understood and appreciated more fully from the following detailed description taken in conjunction with the appended drawings in which.

DETAILED DESCRIPTION

Figure 1:
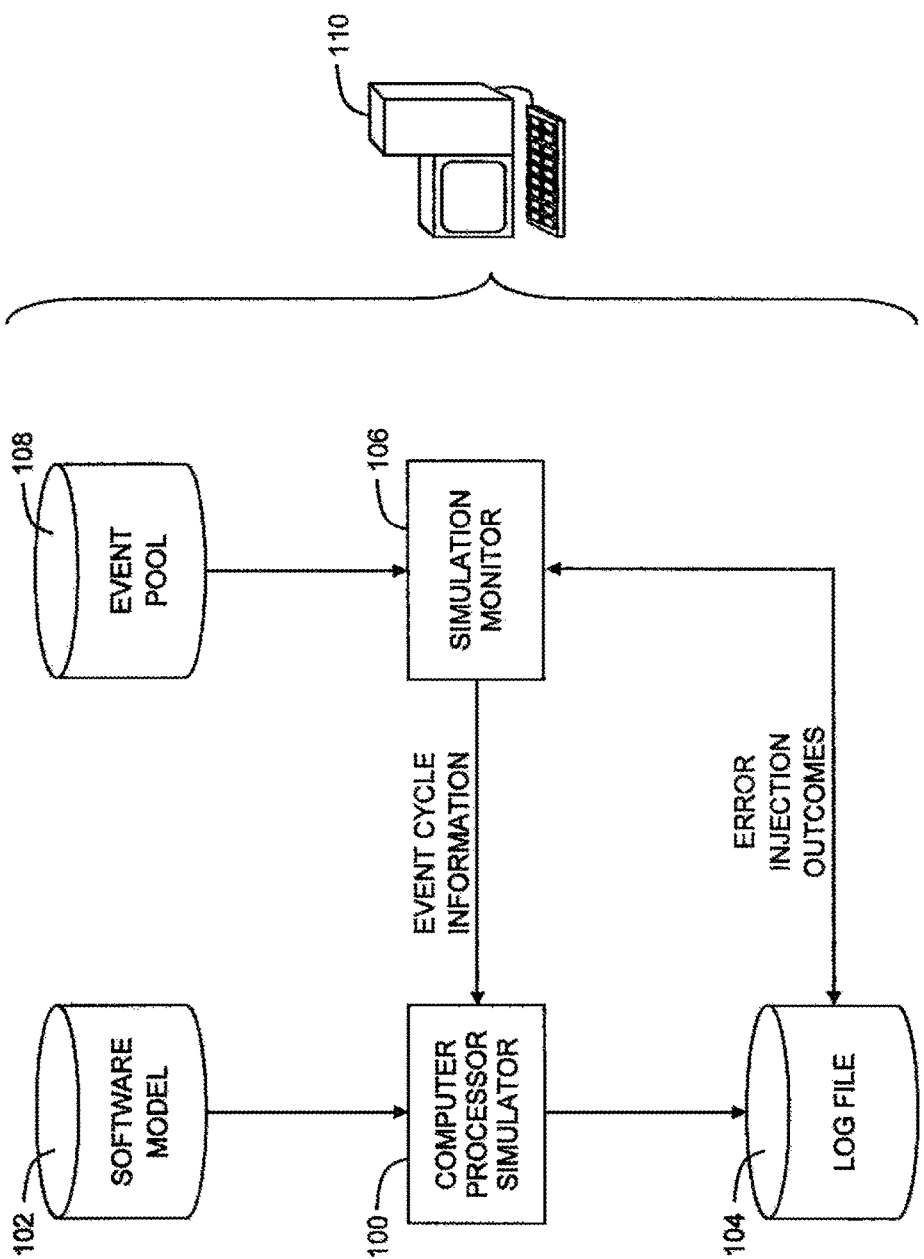
FIG. 1 is one example of a conceptual illustration of a system for checking a computer processor design for soft error handling, constructed and operative in accordance with an embodiment of the invention.

Reference is now made to FIG. 1, which is one example of a conceptual illustration of a system for checking a computer processor design for soft error handling, constructed and operative in accordance with an embodiment of the invention. In the system of FIG. 1, a computer processor simulator 100 is configured, in accordance with conventional techniques, to perform a baseline simulation of a computer processor design using a software model 102 of the computer processor design, such as where software model 102 is constructed using a hardware description language, such as VHSIC Hardware Description Language (VHDL). In one embodiment, computer processor simulator 100 is configured to produce a log file 104 of its simulations, such as where log file 104 indicates each processing cycle and records signal values associated with elements of the computer processor design that are encountered during each processing cycle, as well as which machine instructions were executed during each processing cycle, the execution results, and whether the results are correct.

A simulation monitor 106 is configured to monitor the baseline simulation of the computer processor design, such as by analyzing a log file 104, to identify a target processing cycle of the baseline simulation during which a predefined event, such as may be drawn from an event pool 108, occurs during the baseline simulation. Each such predefined event may be associated with processing a machine instruction that directly accesses an operand, which represents a target for error injection by injecting bit-flip errors into one or more signals associated with a processor logic element that processes the machine instruction. Each event is, for instance, defined to indicate the following:

- a qualifier signal indicating the gating condition to a processor logic element that is targeted for error injection;
- a list of signals, each representing an error injection target, where these signals are to be injected with a bit-flip error when the qualifier signal is active in order to trigger a logic error;
- an injection offset indicating a number of processing cycles to wait before injecting an error after the activation of the qualifier signal, the default injection offset being one cycle after the qualifier signal is encountered.

Computer processor simulator 100 is further configured to perform multiple iterations of a test simulation of the computer processor design in accordance with software model 102 of the computer processor design, performing one or more iterations for each event in event pool 108. During a given iteration, and in association with a given event, and at the target processing cycle identified by simulation monitor 106 for the event (plus any specified injection offset), computer processor simulator 100 injects one or more bit-flip errors into one or more corresponding bits of the predefined error injection target specified by the event, such that in a given iteration for the same event, computer processor simulator 100 injects the same bit-flip errors into a different portion of the error injection target; injects different bit-flip errors into the same portion of the error injection target; or injects different bit-flip errors into a different portion of the error injection target.

Simulation monitor 106 is further configured to determine, such as by again analyzing log file 104 which now contains the results of each test simulation iteration, whether an error injected during a given test simulation iteration is detected by error-checking logic of the computer processor design during the iteration. Where an injected error is detected by error-checking logic of the computer processor design during any, and, in one example, each, of the iterations for a given event, this may indicate a reliability, availability and serviceability (RAS) failure, and the event associated with the injected error may be omitted from future testing, such as by removing it from event pool 108. In one embodiment, simulation monitor 106 is further configured to determine whether a machine instruction that is associated with an event, and that may therefore be affected by an error injection associated with the event, produces a correct result during a test simulation iteration that is associated with the event. Where an injected error is not detected by error-checking logic of the computer processor design during an iteration that is associated with an event, and a machine instruction that is associated with the event produces a correct result during the iteration, this may indicate that the event definition did not accurately specify an injection offset, that the event definition specified target signals that do not accurately match the qualifier signal, or that the specific bit of the target signal that was bit-flipped was not used. In this instance, the designer may decide to modify the event definition or forego future testing of the related signal or bit. Where an injected error is not detected by error-checking logic of the computer processor design during an iteration that is associated with an event, and a machine instruction that is associated with the event produces an incorrect result during the iteration, this may indicate a functional failure. In this instance, the designer may decide to modify or add error detection and correction logic to protect against the related error.

Simulation monitor 106 is configured, in accordance with conventional techniques, to report any of the above post-injection determinations, such as by indicating the error injection outcomes within log file 104, and, for example, specifying any of the following: whether and when an injected error is not detected by error-checking logic, such as in a case of a RAS failure; whether a functional failure was detected, such as when a simulation result does not agree with an expected result. Log file 104 is, e.g., reviewed after each error-injection iteration in order to identify the test outcome for that iteration.

Any of the elements shown in FIG. 1 are, for instance, implemented by one or more computers in computer hardware and/or in computer software embodied in a non-transitory, computer-readable medium in accordance with conventional techniques, such as where any of the elements shown in FIG. 1 are hosted by a computer 110.

Figure 2:
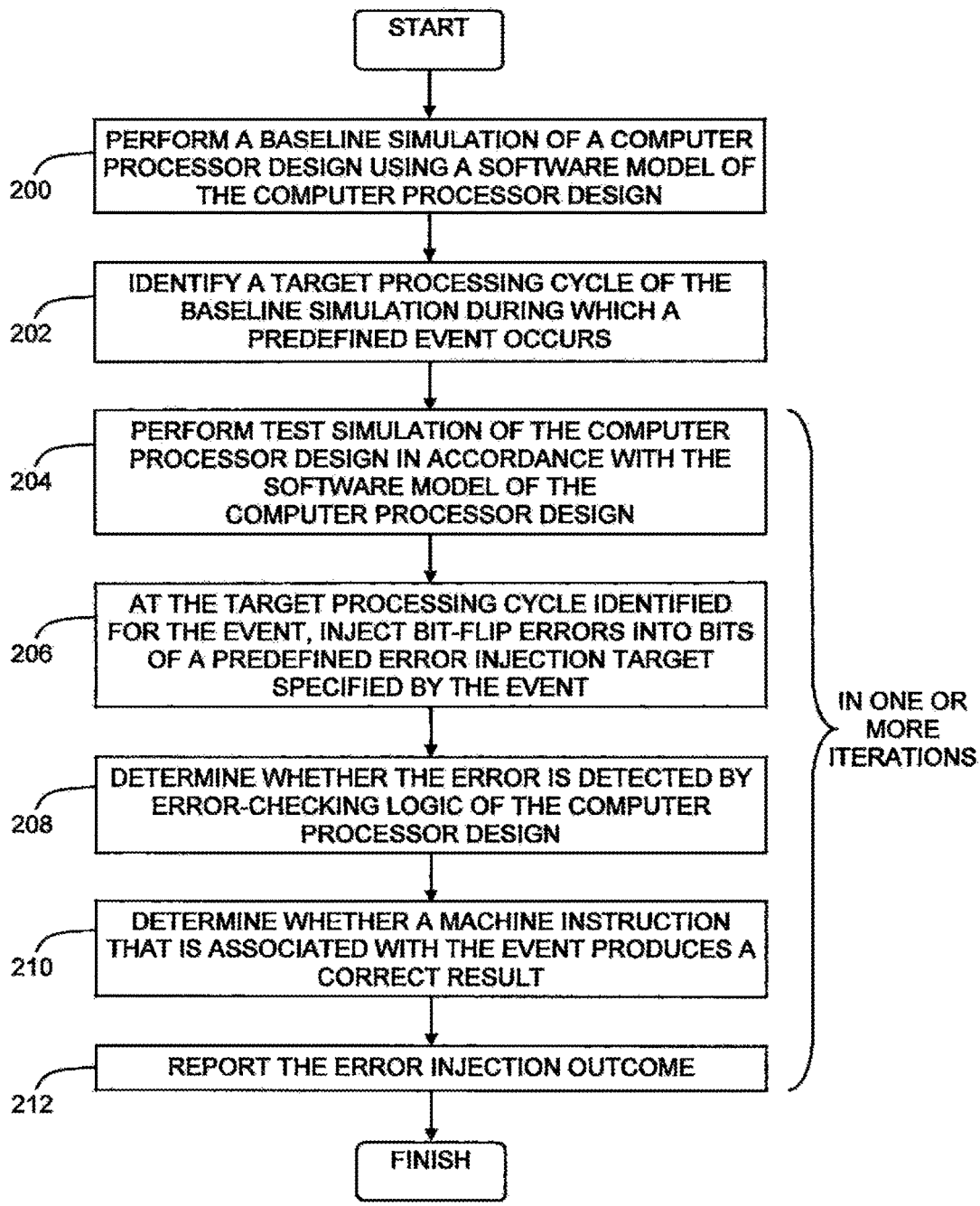
FIG. 2 is one example of a flowchart illustration of an example method of operation of the system of FIG. 1, operative in accordance with an embodiment of the invention.

Reference is now made to FIG. 2, which is one example of a flowchart illustration of an example method of operation of the system of FIG. 1, operative in accordance with an embodiment of the invention. In the method of FIG. 2, a baseline simulation of a computer processor design is performed using a software model of the computer processor design (step 200). A target processing cycle of the baseline simulation is identified during which a predefined event occurs (step 202). In one or more iterations associated with the event, a test simulation of the computer processor design is performed in accordance with the software model of the computer processor design (step 204). During a given iteration, and at the target processing cycle identified for the event, one or more bit-flip errors are injected into one or more corresponding bits of a predefined error injection target specified by the event (step 206). It is then determined whether the error is detected by error-checking logic of the computer processor design during the iteration (step 208), as well as whether a machine instruction that is associated with the event produces a correct result during the iteration (step 210). Outcomes associated with the various error injections are then reported (step 212).

The system of FIG. 1 and method of FIG. 2 may be demonstrated in the context of the following example scenario in which the following machine instructions and source operands are to be processed during simulations of computer processor design:

Add [A, B]—Operands A and B are added together

MultiplyAdd [A, B, C]—Operands A and B are multiplied, and the multiplication result is then added to operand C Given an event that targets operand C for soft error injection, one or more soft errors are to be injected in connection with operand C only for instructions which use operand C (i.e., the Add instruction may be ignored), with soft error injection to occur at the cycle where the relevant machine instruction is executed.

A baseline simulation of the computer processor design is performed, for which the following counter is created in order to identify when operand C is required and at which cycle it is used:

[count; d3_opC]:mux_sel_opC;

where 'count' represents an instruction to the simulator to increment a counter when a condition is met; where 'mux_sel_opC' is the name of the signal to be monitored, and is thus the condition associated with the counter, which specifies that operand C is selected for this instruction; and where 'd3_opC' is both the event name and the name of the signal representing operand C data in computer processor design (i.e., the data bus associated with operand C). During the baseline simulation, the above machine instructions are executed.

Analysis of the baseline simulation reveals that the above condition is met at processing cycle 94 of the baseline simulation.

A first iteration of a test simulation is performed, during which the above machine instructions are executed. At processing cycle 94, 0x55555555 is injected into signal d3_opC' which has a signal width of 32 bits, thus corrupting all 32 bits of the signal with 0's.

A second iteration of the test simulation is performed, during which the above machine instructions are again executed. At processing cycle 94, 0xAAAAAAAA is injected into signal 'd3_opC', thus corrupting all 32 bits of the signal with 1's.

In both iterations, the injected errors were detected by error-checking logic of the computer processor design, indicating a RAS failure. Since the event is "covered" by the error-checking logic, the event is omitted from future testing.

Figure 3:
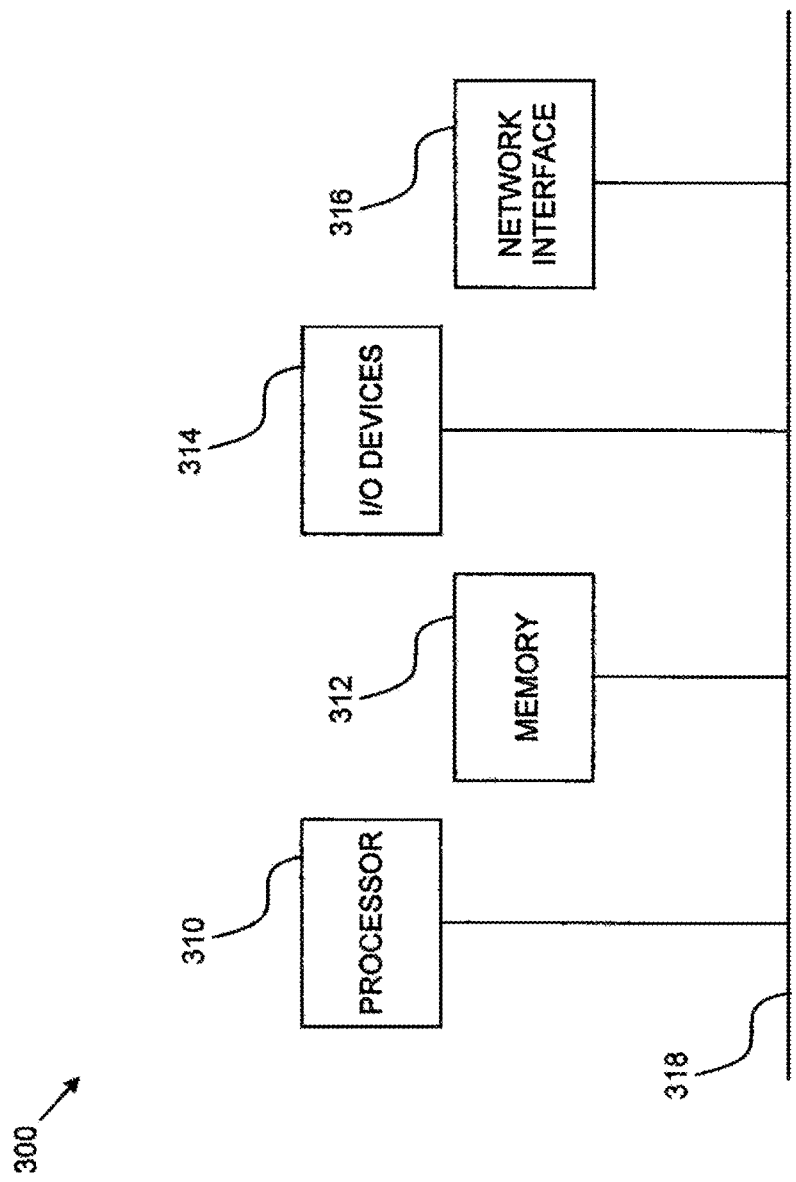
FIG. 3 is one example of a block diagram illustration of an example hardware implementation of a computing system, constructed and operative in accordance with an embodiment of the invention.

Referring now to FIG. 3, block diagram 300 illustrates an example hardware implementation of a computing system in accordance with which one or more components/methodologies of aspects of the invention (e.g., components/methodologies described in the context of FIGS. 1-2) may be implemented, according to an embodiment of the invention.

As shown, aspects of the invention may be implemented in accordance with a processor 310, a memory 312, I/O devices 314, and a network interface 316, coupled via a computer bus 318 or alternate connection arrangement.

It is to be appreciated that the term "processor" as used herein is intended to include any processing device, such as, for example, one that includes a CPU (central processing unit) and/or other processing circuitry. It is also to be understood that the term "processor" may refer to more than one processing device and that various elements associated with a processing device may be shared by other processing devices.

The term "memory" as used herein is intended to include memory associated with a processor or CPU, such as, for example, RAM, ROM, a fixed memory device (e.g., hard drive), a removable memory device (e.g., diskette), flash memory, etc. Such memory may be considered a computer readable storage medium.

In addition, the phrase "input/output devices" or "I/O devices" as used herein is intended to include, for example, one or more input devices (e.g., keyboard, mouse, scanner, etc.) for entering data to the processing unit, and/or one or more output devices (e.g., speaker, display, printer, etc.) for presenting results associated with the processing unit.

As described herein, in one aspect of the invention, a method is provided for checking a computer processor design for soft error handling. The method includes monitoring a baseline simulation of a computer processor design to identify a target processing cycle of the baseline simulation during which a predefined event occurs during the baseline simulation, where the baseline simulation is performed in accordance with a software model of the computer processor design, and where the event is associated with processing an instruction that directly involves a predefined error injection target; performing a test simulation of the computer processor design in accordance with the software model of the computer processor design; injecting an error into the predefined error injection target during the target processing cycle of the test simulation; and determining whether the error is detected by error-checking logic of the computer processor design.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/ or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method of checking a computer processor design for soft error handling, the computer-implemented method comprising:
    performing a baseline simulation of a computer processor design and producing therefrom a log file of the baseline simulation, wherein the baseline simulation is performed in accordance with a software model of the computer processor design, and the log file indicates processing cycles and signal values associated with elements of the computer processor design encountered during the processing cycles, and machine instructions executed during the processing cycles of the baseline simulation;
    monitoring the baseline simulation of a computer processor design by analyzing the log file produced from the baseline simulation to identify a target processing cycle of the baseline simulation during which a predefined event occurs during the baseline simulation, wherein the predefined event is associated with processing an instruction that directly involves a predefined error injection target;
    performing a test simulation of the computer processor design in accordance with the software model of the computer processor design;
    injecting an error into the predefined error injection target during a target processing cycle of the test simulation, wherein the predefined event is defined to indicate an injection offset, the injection offset indicating a number of processing cycles to wait after activation of a signal before injecting the error; and
    determining whether the error is detected by error-checking logic of the computer processor design.

2. The computer-implemented method according to claim 1, wherein the performing the test simulation, the injecting the error and the determining are performed in multiple iterations, wherein in each of the iterations the injecting comprises injecting the same error into a different portion of the predefined error injection target.

3. The computer-implemented method according to claim 1, wherein the performing the test simulation, the injecting the error and the determining are performed in multiple iterations, wherein in each of the iterations the injecting comprises injecting a different error into the same portion of the predefined error injection target.

4. The computer-implemented method according to claim 1, wherein the performing the test simulation, the injecting the error and the determining are performed in multiple iterations, wherein in each of the iterations the injecting comprises injecting a different error into a different portion of the predefined error injection target.

5. The computer-implemented method according to claim 1, further comprising determining whether processing the instruction during the test simulation produces a correct result.

6. The computer-implemented method according to claim 1, wherein the monitoring, the performing, the injecting, and the determining are implemented in computer hardware.

7. The computer-implemented method of claim 1, wherein the injection offset comprises a default injection offset of one cycle after the signal is encountered.

8. The computer-implemented method of claim 1, wherein the signal is a qualifier signal indicating a gating condition to a processor logic element targeted for the error injection.

* * * * *